United States Patent [19]

Jeuch

[11] Patent Number: 4,851,365

[45] Date of Patent: Jul. 25, 1989

[54] PROCESS FOR THE PRODUCTION OF A MEMORY CELL

[75] Inventor: Pierre Jeuch, Seyssins, France

[73] Assignee: Commissariat a l'Energie Atomique, Paris, France

[21] Appl. No.: 216,869

[22] Filed: Jul. 8, 1988

[30] Foreign Application Priority Data

Jul. 10, 1987 [FR] France ................. 87 09844

[51] Int. Cl.[4] .......................................... H01L 21/22
[52] U.S. Cl. ................................... 437/43; 437/40; 437/41; 437/44; 437/48; 437/50; 437/51; 437/190; 437/191; 437/193; 437/228
[58] Field of Search ............... 437/27, 40, 41, 42, 437/43, 51, 52, 193, 228, 190, 191; 365/182; 357/23.5

[56] References Cited

U.S. PATENT DOCUMENTS

| | | | |
|---|---|---|---|
| 4,184,207 | 1/1980 | McElroy | 357/23.5 |
| 4,312,680 | 1/1982 | Hsu | 437/41 |
| 4,378,627 | 4/1983 | Jambotkar | 437/40 |
| 4,400,865 | 8/1983 | Goth et al. | 437/39 |
| 4,419,809 | 12/1983 | Riscman et al. | 437/41 |
| 4,426,764 | 1/1984 | Kosa et al. | 437/193 |
| 4,460,413 | 7/1984 | Hinata et al. | 437/41 |
| 4,493,057 | 1/1985 | McElroy | 357/23.5 |
| 4,597,827 | 7/1986 | Nishitami et al. | 437/41 |
| 4,645,563 | 2/1987 | Terada et al. | 437/41 |

FOREIGN PATENT DOCUMENTS

| | | |
|---|---|---|
| 0055608 | 7/1982 | European Pat. Off. . |
| 0258141 | 3/1988 | European Pat. Off. . |
| WO87/04565 | 7/1987 | World Int. Prop. O. ........... 437/41 |

OTHER PUBLICATIONS

IBM Technical Disclosure Bulletin (vol. 29, No. 3, Aug. 1986, p. 1328).
IBM Technical Disclosure Bulletin (vol. 26, No. 9, Feb. 1984, pp. 4587-4589).

Primary Examiner—Brian E. Hearn
Assistant Examiner—Tom Thomas
Attorney, Agent, or Firm—Nutter, McClennen & Fish

[57] ABSTRACT

A process for producing a memory cell, particularly of the ROM or EPROM type, having a matrix of memory points, each memory point comprising a source, a drain and at least one gate. In a first step, a mask is produced for defining the position of stacks in which the gates are produced. This is followed by the production of the sources and the drains during second and third successive and independent steps. The second step consists of an etching operation, a doping operation and an insulating operation, while the third step involves an etching operation and a doping operation. The operation is completed by producing the conductive lines connecting the drains of the memory points aligned in a direction Y.

9 Claims, 6 Drawing Sheets

PROCESS FOR THE PRODUCTION OF A MEMORY CELL

FIELD OF THE INVENTION

The present invention relates to a process for the production of an integrated memory cell. It more particularly applies to the field of the production of ROM or EPROM-type integrated memory circuits in MOS technology.

An integrated memory is an integrated circuit having the actual memory part, called the memory cell, which is formed from several electrically interconnected memory points and peripheral circuits for controlling the memory points. The invention relates solely to the production of the actual memory part.

The most modern memory cells permit the storage of $10^6$ bits and today have surfaces of 20 to 25 $\mu m^2$ in a 1.2 $\mu m$ technology, i.e. in which the smallest strips and spaces are 1.2 $\mu m$. Therefore the surface of a memory is approximately 14 to 17 times that of the elementary lithography square ($1200 \times 1200$ $nm^2$).

BACKGROUND OF THE INVENTION

FIG. 1 diagramatically shows in perspective a known EPROM cell, i.e. an electrically programmable, read-only memory cell erasable by ultraviolet radiation. As shown in FIG. 1, a memory point is formed from a transistor having a source 4 and a drain 6 produced in a silicon monocrystalline semiconductor substrate 8. The source and drain have opposite conductivities to those of the substrate.

The transistor also comprises a gate insulant 10, generally of silicon oxide, on which are stacked a first gate 12 and a second gate 14, generally of phosphorus-doped polycrystalline silicon. These two gates are separated by a fine insulant film 16, which is generally of silicon oxide. The first gate 12 is a floating gate and the second gate 14 the control gate of the memory point.

This memory point is electrically insulated by means of a field oxide 18 produced by local, surface oxidation of the substrate from the other memory points, as well as the peripheral control circuits of said memory point.

The complete memory cell is covered with a thick insulating layer 22, generally of silicon oxide, in which are formed the electrical contact holes of the sources and drains such as 24. The electrical connections between the sources and drains of the different memory points and/or the different peripheral control circuits are provided by a conductive layer 26, which is generally of aluminum, which is deposited on the insulating layer 22 and appropriately etched.

The electrical connections between the control gates of the different memory points are defined at the same time as the control gates 14 and in the same polycrystalline silicon layer.

Attempts are increasingly being made to reduce the size of integrated circuits and in particular memories with a view to increasing their integration density. Unfortunately, in the presently known memories two factors limit the reduction in the dimensions of the memory cell.

The first factor is the overlap between the floating gate 12 and the field oxide 18. An overlap X1 of the floating gate 12 above the field oxide 18 and an overlap Y1 of the field oxide 18 with respect to the floating gate 12 are necessary due to the imprecision of superimposing of the different layers constituting the memory points and lithography masks necessary for the etching of the different layers. These overlaps are respectively in the direction X of the word lines (or gate connections) of the memory cell and in direction Y of the channels of the memory points, i.e. perpendicular to direction X.

The second factor is the need to provide insulating guards around the contact holes of the bit line, i.e. around the contact holes of the drains of the memory points. An insulating guard X2 is provided in direction X between the drain contact and the field oxide 18 and another insulating guard Y2 is provided in direction Y between the drain contact and gates 12, 14.

The reduction of the lithographic dimensions are not generally accompanied by a proportional improvement in the superimposing accuracies of the different levels, particularly lithographic masks, so that the limiting factors referred to hereinbefore will become increasingly more disadvantageous for increasing the integration density of memories.

Self-alignment or self-positioning processes avoiding the overlap between the floating gate and the field oxide and/or insulating guards around the contact holes consequently become necessary for future generations of memories.

SUMMARY OF THE INVENTION

The present invention relates to a process for the production of a memory cell more particularly making it possible to obviate these various disadvantages. The memory cell has an integral self-alignment or self-positioning of all the elements constituting these memory points, which leads to a memory surface only representing four to five times the minimum lithographic surface. Moreover, the memory cell according to the invention is not limited to micron technology and can be produced according to submicron technology.

More precisely, the present invention relates to a process for the production of an integrated memory cell on a semiconductor substrate having a matrix of memory points electrically insulated from one another, each memory point comprising a drain, a source, a gate and a gate control line, said process comprising the following stages:

(a) a first stage of defining the gates of the memory points and their control line involving the following operations:

(a1) producing a stack of materials, whereof at least one is conductive and is in the form of first parallel strips aligned in a first direction Y, for producing a gate of memory points and whereof at least one other is constituted by a conductive layer for producing the control lines of the gates, (a2) producing a group of second parallel strips, aligned in a second direction X perpendicular to the first direction Y, said strips having at least one insulating material layer, (a3) producing spacers on each flank of said second strips, said spacers forming strips in the second direction X, said gates being defined by superimposing zones of said spacers and said first strips, the control lines being defined by the spacers, (b) a second stage of producing sources of memory points involving the following operations:

(b1) etching layers not protected by spacers or by materials constituting the second strips, (b2) doping the substrate exposed by said etching operation, (b3) deposition of an insulating material on the doped zones, (c) a third stage of producing drains of memory points involving the following operations:

(c1) elimination by etching of the materials constituting the second strips, (c2) elimination by complete or partial etching of the materials constituting the stack exposed during the previous etching operation, (c3) doping the substrate in the regions etched in the preceding stage, (c4) insulation of the drain-side flanks of the gates exposed by the preceding etching operations, (d) a fourth stage of producing parallel conductive lines, aligned in accordance with the first direction, said conductive lines being electrically connected to the drains of the memory points.

According to the invention, the sources and drains of the memory points are produced during two independent successive stages. This makes it possible to carry out different doping processes for the sources and for the drains. Moreover, the width of the gates is defined in the first stage of the process by a mask constituted by spacers, which offers the advantage of making it easier to produce gates of submicron width.

Preferably, the spacers produced during the first stage are obtained by the deposition of an insulating material layer on the complete surface of the semiconductor substrate, followed by anisotropic etching of said insulating layer over its entire thickness.

Preferably, the material of the stack in which the gates will be obtained is produced in the form of first strips by local oxidation of a polycrystalline silicone layer doped through a mask, the oxidized zones constituting a group of three parallel strips.

Advantageously, the insulation of the drain-side flank of the gates during the third stage is obtained by a spacer produced from an insulating material.

According to a secondary feature, said spacer is obtained by depositing an insulating material layer on the complete surface of the semiconductor substrate and then anisotropically etching said insulating material layer.

In preferred manner, for producing an EPROM cell, the stack is constituted by a first gate oxide layer, a second conductive material layer, in which will be etched the so-called floating gates, of the memory points, said first and second layers forming said first strips, a third insulating material layer, a fourth conductive material layer, in which will be etched the control line of the memory points also forming the control gates of the memory points and a fifth insulating material layer.

In the same way, for producing a ROM cell, the stack is preferably constituted by a first gate oxide layer, a second conductive material layer, in which will be etched the gates of the memory points, said first and second layers forming said first strips, a third conductive material layer in which will be etched the control lines of the memory points and a fourth insulating material layer.

DESCRIPTION OF THE DRAWINGS

The invention is described in greater detail hereinafter relative to non-limitative embodiments and the attached drawings, wherein show.

SPECIFIC DESCRIPTION

Figure 2:
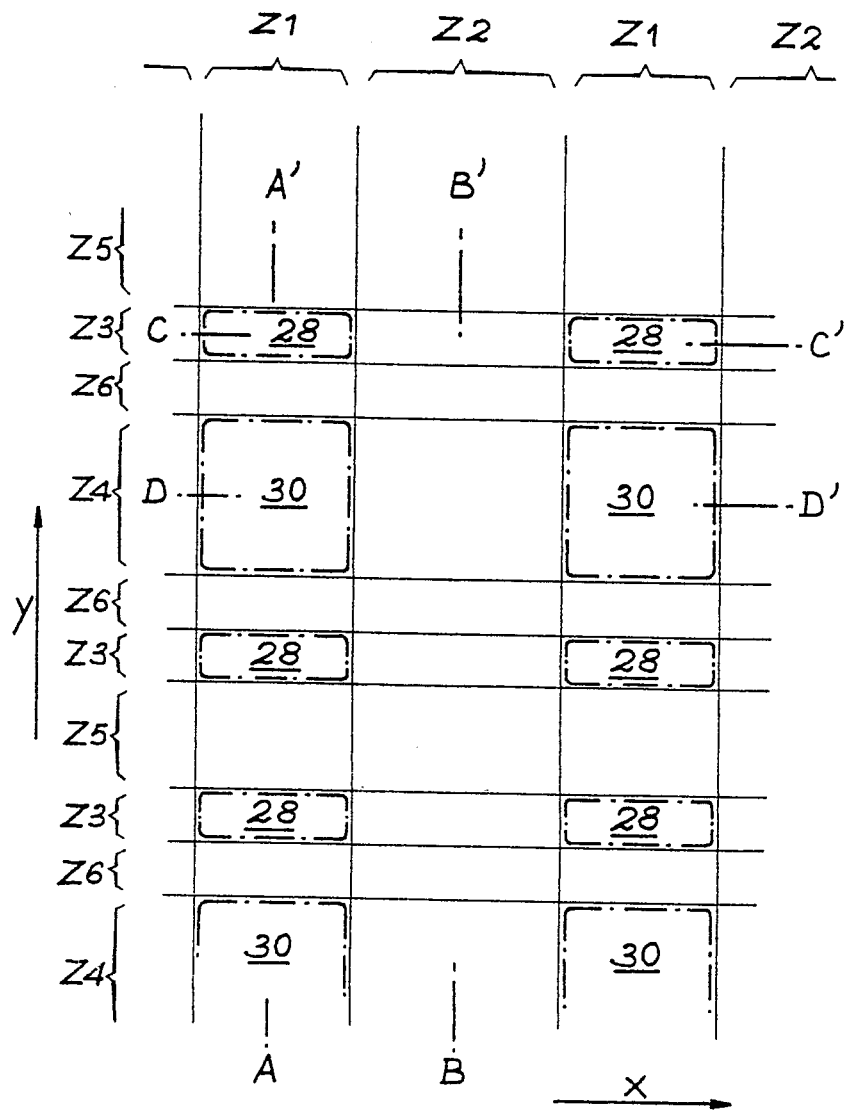
FIG. 2 diagrammatically in plan view the arrangement of the memory points of a memory cell obtained according to the invention.

FIG. 2 is a plan view of a memory cell according to the invention showing the position of the memory points and the position of the contact holes of the drains of said memory points.

The memory cell is subdivided in a direction X into parallel strips alternatively comprising strip $z_1$ and $z_2$. The strips $z_1$ and $z_2$ do not necessarily have the same width. The memory cell is also subdivided in direction Y perpendicular to direction X into four types of strips $z_3$, $z_4$, $z_5$ and $z_6$. The widths of these strips are not necessarily equal. These strips are disposed in direction Y in accordance with the repeated pattern $z_4$, $z_6$, $z_3$, $z_5$, $z_3$ and $z_6$.

Each memory point comprises a source, a drain and at least one gate. This gate is defined by the region 28 constituted by the intersection of strips $z_1$ and $z_3$. The regions 30 constituted by the intersection of a strip $z_1$ and a strip $z_4$ correspond to the contact holes of the drains of the memory points. The drain of each memory point is thus located beneath the region defined by the intersection between a strip $z_1$ and a strip $z_6$. Finally, the source of each memory point is located beneath the region defined by the intersection between a strip $z_1$ and a strip $z_5$.

In the following description, reference is made in exemplified manner to an EPROM cell formed from memory points with a N channel produced on a type p monocrystalline silicon substrate. However, the invention is not limited to this embodiment, but in fact applies to all memory types (ROM, EPROM, EEPROM, etc.) produced on a random semiconductor substrate.

Figure 3:
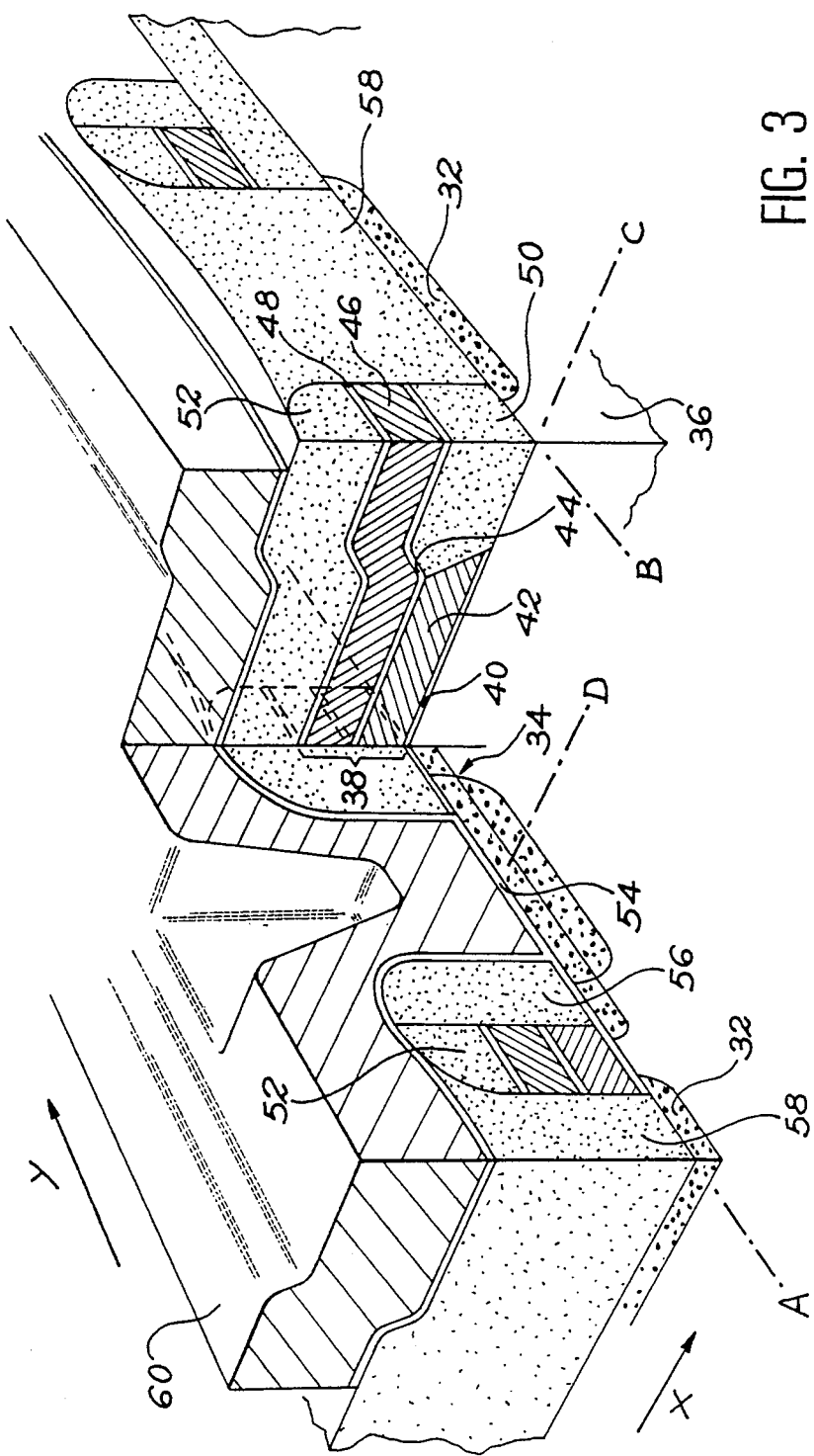
FIG. 3 is perspective a memory cell obtained according to the inventive process.

The EPROM cell shown in FIG. 3 comprises, like the prior art memory cells, a memory point matrix, each having a source 32 and a drain 34 of the n+ type produced in a type p monocrystalline silicon substrate 36. Stacks 38 of materials are provided between the sources and the drains.

These stacks 38, starting from substrate 36, are formed from a first silicon oxide insulant 40, a phosphorus-doped polycrystalline silicon floating gate 42, a second insulant 44 formed from three stacked insulating materials $SiO_2$, $Si_3N_4$ and $SiO_2$, a phosphorus-doped polycrystalline silicon control gate 46 and optionally a silicon oxide layer 48.

In order to electrically insulate from one another the successive memory points in direction X, lateral insulations 50 made from insulating material, such as silicon oxide are provided.

According to the invention, the width of the gates of memory points, i.e. the extension of these gates in direction Y is defined by a spacer 52. These spacers are in the form of strips oriented in direction X. These spacers 52 serve as a mask for etching the gates. The flanks of the gates are protected by insulating materials. The flank of the gates on the side of drain 34 is insulated from the contact hole 54 by an insulating material 56, preferably in the form of a spacer. In the same way, the flank of the gates of the side of source 32 is protected by the deposition of an insulating material layer 58.

The memory points of the memory cell are organized in matrix form in accordance with directions X and Y. They are arranged in words in direction X. The memory points aligned in direction X have their gates interconnected by a conductive line, which is constituted by the layer 46 forming the control gate of each of the memory points. The selection of a bit in a word is obtained by a conductive line 60, called the bit line, which interconnects the drains 34 aligned in direction Y via holes 54.

The memory cell obtained according to the production process according to the invention shown in FIG. 3 makes it possible to cancel out the overlap Y1 of field oxide 50 with respect to the floating gate 42 and greatly reduce the insulating guard Y2 between the drain contact 54 and stacks 38. This process also makes it possible to eliminate, in known manner, the overlap X1 of floating gate 42 or that of the field oxide 50 and the insulating guard X2 between the drain contact 54 and the field oxide 50.

A description will now be given with reference to FIGS. 4a to 4h of a process for producing a memory cell according to the invention, which makes it possible to obtain a memory cell like that shown in FIG. 3.

Figure 5:
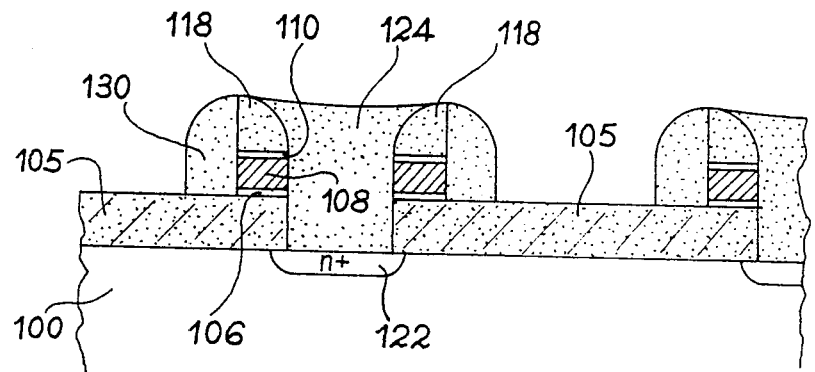
FIGS. 5, 6 and 7 respectively sections along axes BB', CC' and DD' of FIG. 2.
Figure 6:
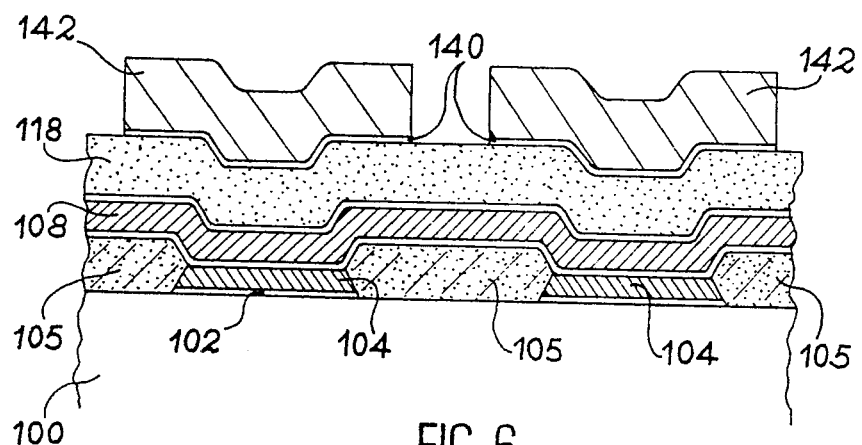
Figure 7:
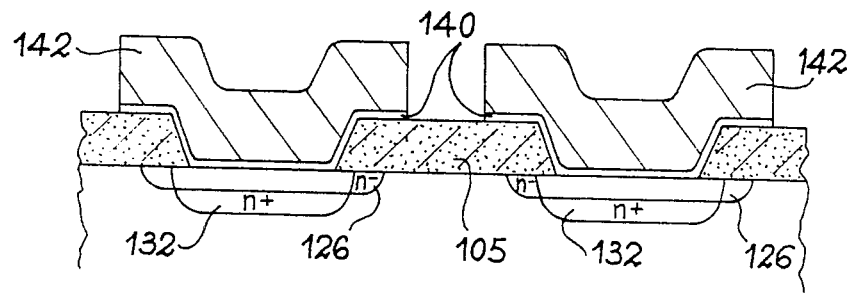

The inventive process will mainly be described with reference to FIGS. 4a to 4h, which show sections along axis AA' of the memory cell of FIG. 2. Reference will also be made to FIGS. 5, 6 and 7, which respectively correspond to sections along axes BB', CC' and DD' of FIG. 2.

As stated hereinbefore, the production process involves four stages, namely a first stage of defining gates of the memory points, a second stage of producing sources of memory points, a third stage of producing drains of memory points and a fourth stage of producing bit lines.

Figure 4A:
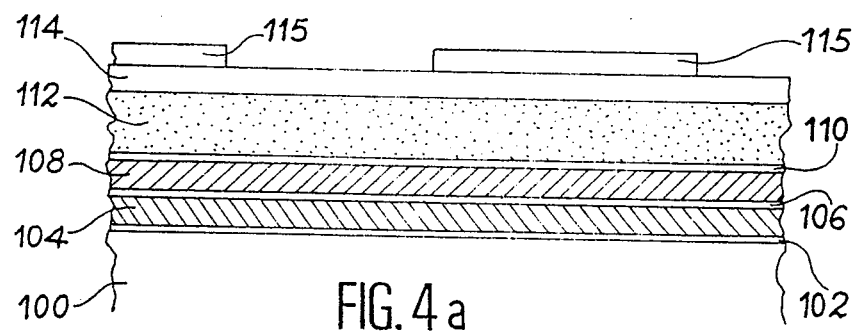
FIGS. 4a to 4h sections along line AA' in FIG. 2, diagrammatically illustrating the different stages of the production process for an EPROM point according to the invention.

As shown in FIG. 4a, this process firstly consists of covering an e.g. p-type monocrystalline silicon semiconductor substrate 100 with a silicon dioxide $SiO_2$ layer 102. The thickness of layer 102 is 25 micrometers and it is obtained by thermal oxidation of the substrate at a temperature close to 900° C. Layer 102 will subsequently constitute the gate oxide of the memory points to be produced.

This is followed by a phosphorus-doped polycrystalline silicon layer 104 being deposited by diffusion of $POCL_3$. This layer 104 deposited by chemical vapor phase deposition (CVD or LPCVD) has a thickness of 250 micrometers. In said layer 104 will be subsequently produced the first or floating gate of the memory point.

This is followed by a first silicon nitride mask produced in conventional manner by a deposition followed by etching through a lithography mask. This first mask is constituted by strips $z_1$ (cf. FIG. 2), which are parallel and aligned in direction Y in order to oxidize layer 104, e.g. by thermal oxidation at 900° C. This gives strips $z_2$ (cf.FIG. 2) forming an insulant, called the field oxide, which makes it possible to insulate the consecutive memory points aligned in accordance with direction X.

Figure 1:
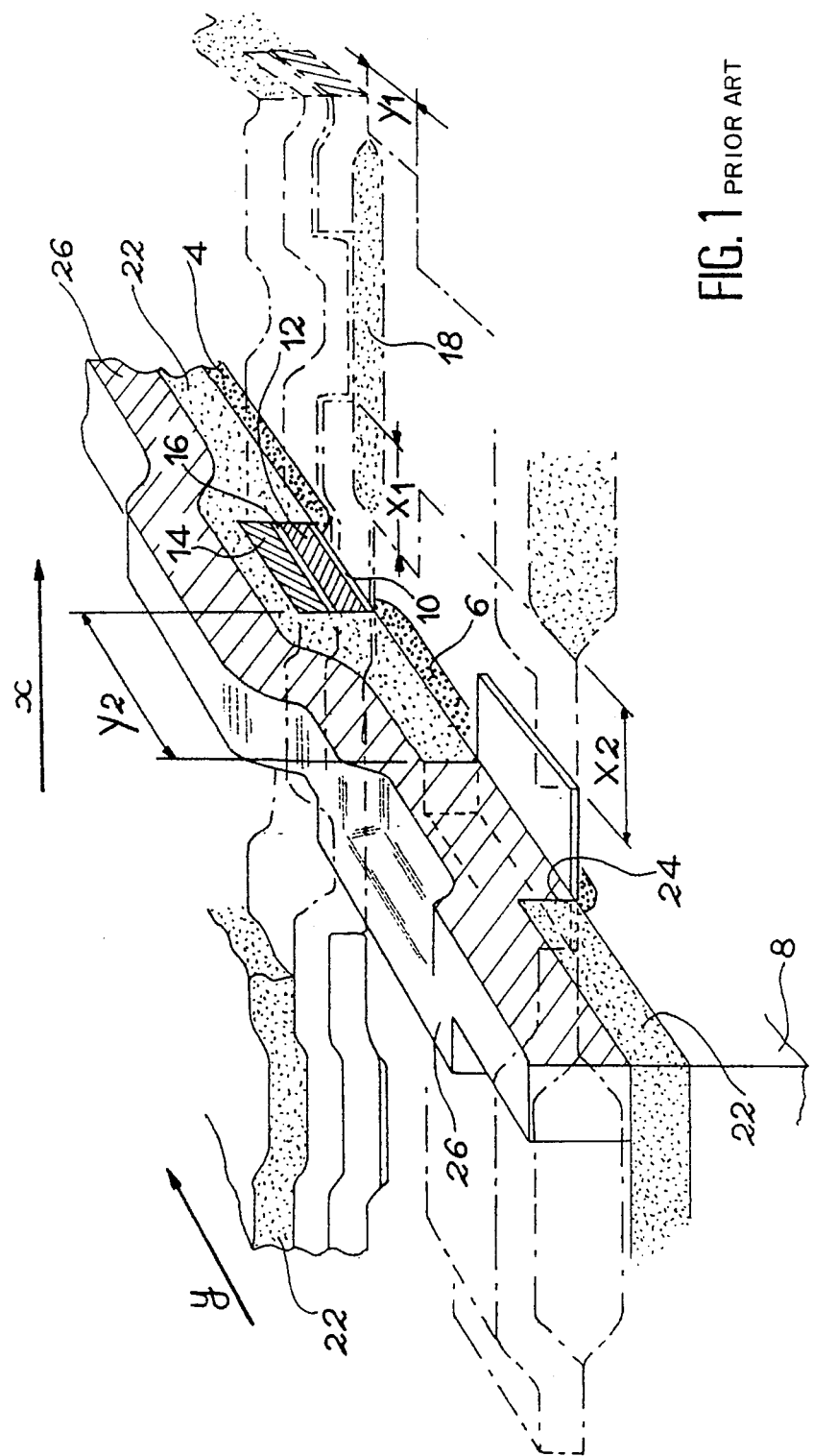
FIG. 1, already described, diagrammatically in perspective a known EPROM cell.

FIG. 6 is a sectional view of the memory cell of FIG. 2 in accordance with axis CC'. It is possible to see in cross-section, the strips $z_1$ constituted by material 102 and 104 and strips $z_2$ constituted by material 105 resulting from the oxidation of material 104. Strips 104 and 105 are self-aligned, i.e. the overlap X1 and insulating guard X2, which would be necessary in the prior art memory cells shown in FIG. 1, are eliminated here.

On returning to FIG. 4a, on layer 104 is produced a dielectric insulant layer 106. The latter is e.g. constituted by a stack of three layers, successively comprising a silicon oxide layer of thickness 15 micrometers produced by the thermal oxidation of layer 104, a silicon nitride layer of thickness 10 micrometers deposited by LPCVD and a silicon oxide layer of thickness 5 micrometers obtained by oxidation of the silicon nitride layer. The two latter silicon nitride and silicon oxide layers are produced at the same time on layer 105. Throughout the remainder of the text the reference numeral 106 will designate the layer constituted by the group of said layers. On said layer, will subsequently be deposited a conductive layer 108, in which will be formed the control gate of each memory point. This layer 108 can be of doped polycrystalline silicon or polycrystalline silicon covered with a silicide layer.

The operations described hitherto are known and are in particular referred to in the article "SEPOX compatible high density floating gate EPROM structure" by N. Matsukawa et al, pp 108, 109, published in VLSI Symposium, 1983.

Layer 108 is covered with a 50 micrometers thick oxide layer 110 deposited by low pressure chemical vapour phase technology (LPCVD).

On layer 110 is deposited a 800 micrometers thick polycrystalline silicon layer 112 and a 100 micrometer thick silicon oxide layer 114. Layers 112 and 114 are e.g. deposited by LPCVD. According to the invention, layers 112 and 114 will protect the zones in which the drains of the memory points will be produced during the etching of the layers deposited above future sources of said memory points. Thus, the etching operations of the gates on the source and drain sides are made independent.

Use in then made of a second lithography mask constituted by resin strips 115, corresponding to strips $z_4$ in FIG. 2, for the reactive ionic etching of layers 112 and 114. Thus, the resin mask protects the zones in which will be made the drains of the memory points.

Etching of layers 114 and 112 is brought about respectively by means of a $CHF_3$ plasma and a $SF_6$ plasma. These etching operations do not affect layer 110.

Figure 4B:
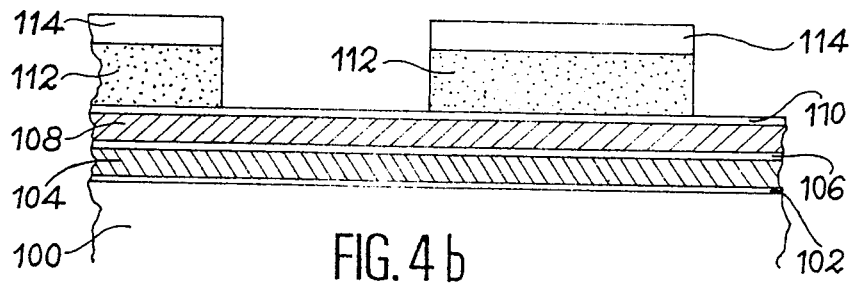
Figure 4C:
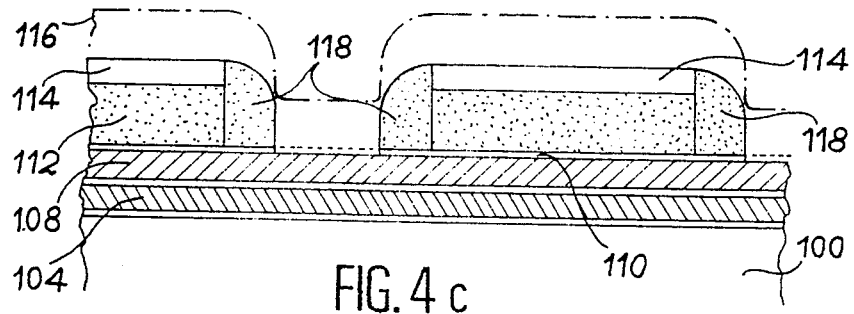

Following the elimination of the second resin mask 115, the memory cell is in a sectional view along axis AA' as shown in FIG. 4b.

The following operation constitutes the last operation of the stage of defining the gates of the memory points. It consists of producing masks for etching the gates, said masks being constituted by spacers. The production of these spacers will be described relative to FIG. 4c.

To produce these spacers, a silicon oxide layer 116 is deposited, e.g. by LPCVD and this is anisotropically etched, e.g. by reactive ionic etching, which also eliminates layer 110. The spacers obtained have a width equal to the thickness of layer 116.

The definition of the dimensions of the gates by spacers is advantageous because it makes it possible to produce submicron gates with an excellent dimensional control, without using high performance lithography tools. It should in particular be noted that the mask, constituted by spacers 118, which is used for defining the position of the gates and which is consequently used for etching the layers 112, 114, requires a much smaller resolution than the size of the patterns produced. It should also be noted that the second resin mask 115 is constituted by strips, whose spacing is equal to twice the spacing of the memory cells. This has the advantage of producing smaller memory cells with a given lithography resolution.

The obtaining of gates with a submicron width also has the advantage that the writing in the memory point can take place at a voltage of 5 volts, unlike the 10 or 12 volts presently used, because in the submicron channels the hot electrons are produced at lower voltages.

Figure 4D:
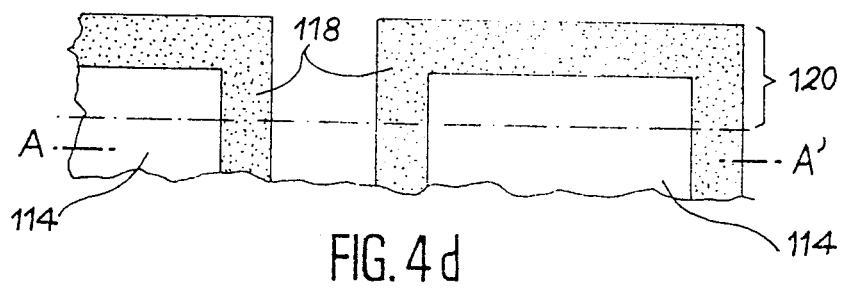

FIG. 4d is a plan view showing the strips 114 surrounded by a cord constituted by spacer 118. To ensure that there is no short-circuiting between two memory points on either side of the same strip 114, that part of spacer 118 located at the end of each strip 114 should be eliminated. Thus, use is made of a third lithography mask making it possible to eliminate spacer 118 in zone 120, said elimination being e.g. carried out by chemical etching with hydrofluoric acid (HF). Following this stage, spacers in strips corresponding to strips $z_3$ of FIG. 2 are obtained.

The first stage of the process according to the invention, consisting of defining the gates of the memory points is ended. Thus, these gates are defined in direction X (cf. FIG. 2) by the width of the strips (cf. FIG. 6) and in direction Y by the width of the spacers 118 of FIG. 4c.

The following operations consist of producing the sources and drains of the memory points. According to the invention, the sources and drains are successively produced in two consecutive, independent stages.

Figure 4E:
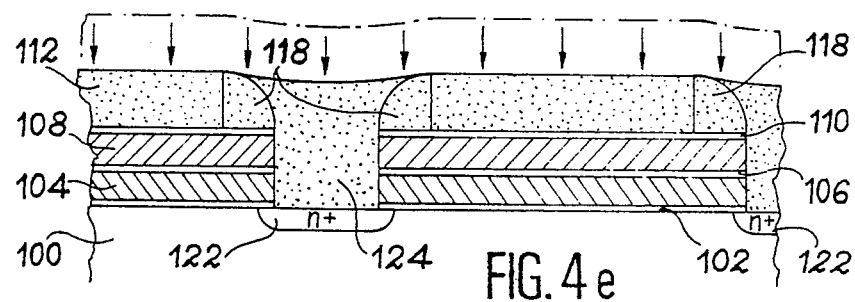

A description will be given with reference to FIG. 4e of the second stage of the inventive process, which consists of producing the sources of the memory points. This second stage comprises a first operation of etching successive layers 108, 106, 104, 105 and 102 of zones, which will not be protected by layers 114 or 118. The layers etched in this way correspond to the strips $z_5$ of FIG. 2. These layers are anisotropically etched by reactive ionic etching. Use is respectively made of a $SF_6$, $CHF_3$, $SF_6$ and $CHF_3$ plasma for layers 108, 106, 104 and 105/102.

This is followed by the doping of the substrate 100 exposed by the etching operation. In the case of a type p silicon substrate, said doping 122 can be carried out by implanting arsenic ions at a dose of $5 \times 10^{15}$ at/cm$^2$ with an energy of 100 keV. This is followed by a heat treatment, e.g. at 850° C. for 30 minutes, in order to electrically activate the ions implanted in substrate 100. This is followed by the deposition of an insulating layer, e.g. BPSG by chemical vapor phase deposition over a thickness of 800 micrometers. This is followed by the flow of said insulating layer, e.g. at 900° C. for 20 minutes, in order to obtain a planar surface. This is followed by the etching of the insulating layer and layer 114 for exposing layer 112.

Insulating layer 124 is then in the form of a group of parallel strips, corresponding to strips $z_5$ in FIG. 2, which protect sources 122 and makes it possible to etch layers 112.

Figure 4F:
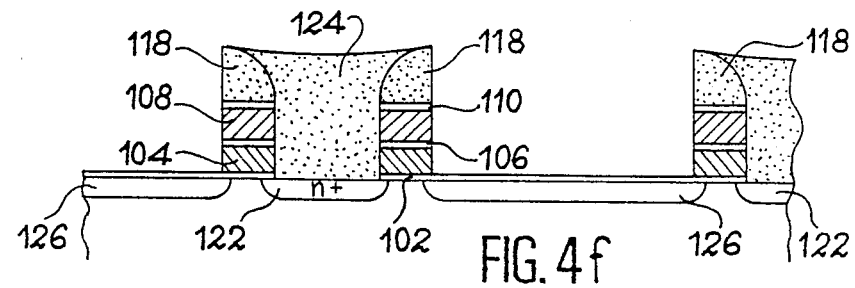

As shown in FIG. 4f, the etching of layers 112 and layers 110, 108, 106 and 104 protected by layer 112 is carried out in order to produce the drains of the memory points. Layers 112, 110, 108, 106 and 104 are anisotropically etched by reactive ionic etching. The etching of the successive layers is respectively carried out with the aid of a $SF_6$, $CHF_3$, $SF_6$, $CHF_3$, $SF_6$ plasma. It should be noted that the etching of layer 104 does not lead to the etching of layers 105 and 102 (cf. FIGS. 5 and 6). Layer 105 electrically insulates the drains from one another.

The inventive process, which consists of separating the operations of producing the sources and drains of the memory points, has the advantage of permitting a different doping of the sources and drains. Thus, for example, there is double ionic implantation for producing the drains, whereas there is only a single ionic implantation for producing the sources. These implantation differences can be used with advantage in the case of an EPROM cell for using the source as a drain at the time of writing.

Figure 4G:
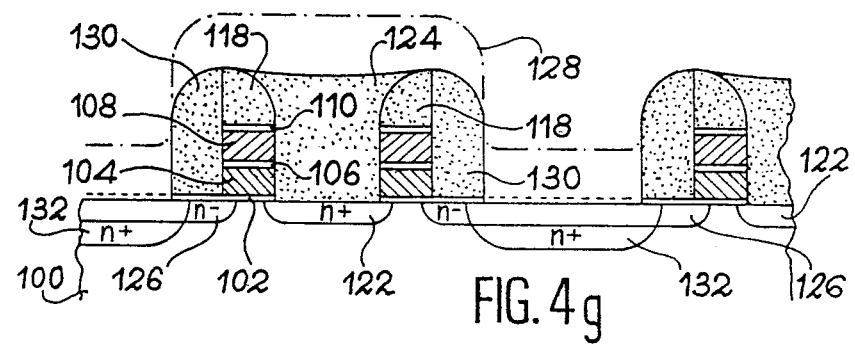

As shown in FIG. 4f, a first doping 126 takes place by implanting phosphorus ions at a dose of $2 \times 10^{13}$ at/cm$^2$ with an energy of 40 keV. The gates of the drain side are then insulated by depositing an insulating material. In preferred manner and as shown in FIG. 4g, this insulating material is in the form of a spacer. In order to obtain it, a silicon oxide layer 128 of thickness 400 micrometers is deposited. This layer is then anisotropically etched by reactive ionic etching with $CHF_3$ plasma, which gives spacers 130.

It is then possible to carry out a second doping 132 of the drains by implanting arsenic ions at a dose of $5 \times 10^{15}$ at/cm$^2$ with an energy of 100 keV. This is followed by a heat treatment, e.g. at 900° C. for 30 minutes, in order to electrically activate the implanted ions.

All that remains is to proceed with the fourth stage of the production process according to the invention, which comprises producing the conductive lines for the selection of the memory points.

For addressing the memory points, use is made of a first group of parallel conductive lines aligned in direction X and a second group of parallel conductive lines aligned in direction Y. The conductive lines parallel to direction X are word lines, because they make it possible to simultaneously address the memory points corresponding to the different bits of the same binary word. As can be seen in FIG. 3, these work lines are constituted by layer 46 forming control gates of the different memory points. These word lines are visible in cross-section in FIGS. 4f to 4h, in which they carry the reference 108.

Figure 4H:
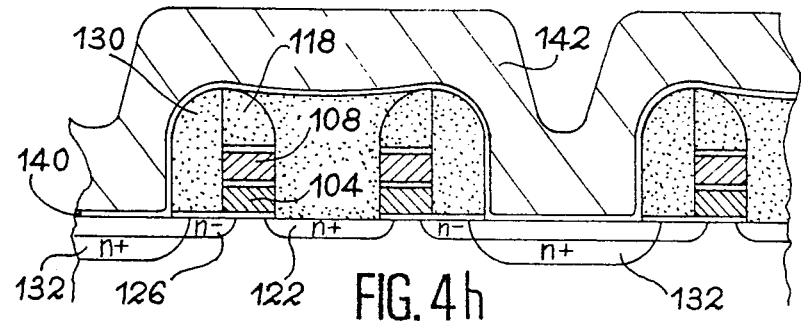

As shown in FIG. 4h, the bit lines are obtained by a first deposition of a metal layer 140, formed e.g. form TiN and a second deposition of an aluminum layer 142 over a thickness of 800 micrometers. This aluminum layer can be deposited by magnetic sputtering.

Use is then made of a fourth lithography mask for defining the bit lines. This mask is constituted by strips covering strips $z_1$ (FIG. 2) and slightly wider than the latter. This is followed by reactive ionic anisotropic etching using carbon tetrachloride as the etching agent. This gives conductive lines, whose cross-section is as shown in FIGS. 6 and 7.

In order to supply the different memory points, it is possible to connect the sources to a supply line provided every N memory points (N=16 or 32 for example), such as a bit line described hereinbefore. The drains connected by this line are then short-circuited with the sources of the corresponding memory points by a common doping carried out via ionic implantation through an appropriate mask before any other operation of producing the memory points.

I claim:

1. Process for the production of an integrated memory cell on a semiconductor substrate having a matrix of memory points electrically insulated from one another, each memory point comprising a drain, a source, a gate and a gate control line, said process comprising the following steps:
   (a) a first step of defining the gates of the memory points and their control line involving the following operations:
   (a1) producing a stack of materials, whereof at least one is conductive and is in the form of first parallel strips aligned in a first direction (Y), for producing a gate of memory points and whereof at least one other is constituted by a conductive layer for producing the control lines of the gates,
   (a2) producing a group of second parallel strips, aligned in a second direction (X) perpendicular to the first direction (Y), said strips having at least one insulating material layer,
   (a3) producing spacers on each flank of said second strips, said spacers forming strips in the second direction (X), said gates being defined by superimposing zones of said spacers and said first strips, the control lines being defined by the spacers,
   (b) a second step of producing sources of memory points involving the following operations:
   (b1) etching layers not protected by spacers or by materials consituting the second strips,
   (b2) doping the substrate exposed by said etching operation,
   (b3) deposition of an insulating material on the doped zones,
   (c) a third step of producing drains of memory points involving the
   following operations:
   (c1) elimination by etching of the materials constituting the second strips,
   (c2) elimination by complete or partial etching of the materials constituting the stack exposed during the previous etching operation,
   (c3) doping the substrate in the regions etched in the preceding step,
   (c4) insulating of the drain-side flanks of the gates exposed by the preceding etching operations,
   (d) a fourth stage of producing parallel conductive lines, aligned in accordance with the first direction, said conductive lines being electrically connected to the drains of the memory points.

2. Production process according to claim 1, wherein the spacers produced during the first step are obtained by depositing an insulating material layer on the complete surface of the semiconductor substrate and anisotropically etching said insulating layer over its entire thickness.

3. Production process according to claim 1, wherein the material of the stack in which the gates will be obtained is produced in the form of first strips by local oxidation of a polycrystalline silicon layer doped through a mask, the oxidized zones constituting a group of three parallel strips forming a field oxide.

4. Production process according to claim 1, wherein the insulation of the flank of the gates during the third stage is obtained by a spacer made from an insulating material.

5. Production process according to claim 4, wherein said spacer is obtained by depositing an insulating material layer on the complete surface of the semiconductor substrate and anisotropically etching said insulating material layer.

6. Production process for an EPROM cell according to claim 1, wherein the stack is constituted by a first gate oxide layer, a second conductive material layer, in which will be etched the gates of the memory points, said first and second layers forming said first strips, a third insulating material layer, a fourth conductive material layer, in which will be etched the control lines of the memory points, and a fifth insulating material layer.

7. Production process for a ROM cell according to claim 1, wherein the stack is constituted by a first gate oxide layer, a second conductive material layer, in which will be etched the gates of the memory points, said first and second layers forming said first strips, a third conductive material layer, in which will be etched the control lines of the memory points, and a fourth insulating material layer.

8. Production process for a memory cell according to claim 1, wherein there are different dopings of the drains and sources.

9. Production process for a memory cell according to claim 8, wherein the doping of the drains successively comprise a first ionic implantation and a second ionic implantation, the dose of the second implantation exceeding that of the first and the zones implanted during the second implantation are smaller than those implanted during the first implantation.

* * * * *

UNITED STATES PATENT AND TRADEMARK OFFICE
CERTIFICATE OF CORRECTION

PATENT NO. : 4,851,365  Page 1 of 2

DATED : July 25, 1989

INVENTOR(S) : Pierre Jeuch

It is certified that error appears in the above-identified patent and that said Letters Patent is hereby corrected as shown below:

Column 5, line 46, please replace "micrometers" with --nanometers--;
Column 5, line 55, please replace "micrometers" with --nanometers--;
Column 6, line 9, please replace "micrometers" with --nanometers--;
Column 6, line 11, please replace "micrometers" with --nanometers--;
Column 6, lines 12-13, please replace "micrometers" with --nanometers--;
Column 6, line 28, please replace "micrometers" with --nanometer--;
Column 6, line 31, please replace "micrometers" with --nanometer--;
Column 6, line 32, please replace "micrometer" with --nanometer--;
Column 7, line 55, please replace "micrometers" with --nanometers--;
Column 8, lines 23-24, please replace "micrometers" with --nanometers--; and

UNITED STATES PATENT AND TRADEMARK OFFICE
CERTIFICATE OF CORRECTION

PATENT NO. : 4,851,365

DATED : July 25, 1989

INVENTOR(S) : Pierre Jeuch

It is certified that error appears in the above-identified patent and that said Letters Patent is hereby corrected as shown below:

Column 8, line 51, please replace "micrometers" with --nanometers--.

Signed and Sealed this

Eighteenth Day of February, 1992

Attest:

HARRY F. MANBECK, JR.

*Attesting Officer*  *Commissioner of Patents and Trademarks*